United States Patent
Yoshida

(10) Patent No.: US 7,119,626 B2
(45) Date of Patent: Oct. 10, 2006

(54) OSCILLATION CIRCUIT AND OPERATION METHOD THEREOF

(75) Inventor: Jun Yoshida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 80 days.

(21) Appl. No.: 11/023,661

(22) Filed: Dec. 29, 2004

(65) Prior Publication Data

US 2005/0184821 A1    Aug. 25, 2005

(30) Foreign Application Priority Data

Jan. 9, 2004    (JP)    ............................. 2004-004624

(51) Int. Cl.
*H03L 7/00* (2006.01)

(52) U.S. Cl. .................. 331/113 R; 331/111; 331/143; 331/144; 331/36 C

(58) Field of Classification Search ............ 331/113 R, 331/143, 144, 111, 36 C
See application file for complete search history.

(56) References Cited

U.S. PATENT DOCUMENTS 3,946,330 A * 3/1976 Takahashi ...................... 331/8

5,896,070 A * 4/1999 Tchamov et al. ........ 331/113 R

FOREIGN PATENT DOCUMENTS

JP    62-274913    11/1987

* cited by examiner

*Primary Examiner*—Arnold Kinkead
(74) *Attorney, Agent, or Firm*—McGinn IP Law Group, PLLC

(57) ABSTRACT

An oscillation circuit has: a first MOS transistor having a gate connected to a first node and a source connected to the ground; a second MOS transistor having a gate connected to a second node and a source connected to the ground; a current supply circuit supplying a control current; a threshold correction circuit supplying a correction current; and a charge-discharge circuit which supplies a charge current which is a superposition of the control current and the correction current to the first node and the second node alternately in response to potentials of drains of the first and the second MOS transistors. The threshold correction circuit increases the correction current as threshold voltages of the first and the second MOS transistors become large.

12 Claims, 1 Drawing Sheet

OSCILLATION CIRCUIT AND OPERATION METHOD THEREOF

BACKGROUND OF THE INVENTION

1. Field of the Invention

The present invention relates to an oscillation circuit. In particular, the present invention relates to an oscillation circuit including an astable multivibrator.

2. Description of the Related Art

An oscillation circuit is often configured with an astable multivibrator. A typical astable multivibrator charges and discharges two capacitors alternately to generate oscillation waveforms. A circuit for charging and discharging these capacitors is mounted in such the astable multivibrator. The voltages applied to the capacitors are fed back to the charge-discharge circuit, and the charge-discharge circuit charges and discharges the two capacitors in response to the applied voltages.

Oscillation frequency of the astable multivibrator is determined by the time required for charging and discharging the two capacitors. This charge-discharge time can be controlled easily by adjusting a charging current for charging the capacitor. Therefore, the oscillation frequency is often controlled by the charging current. The charging current can be used for controlling the oscillation frequency, and hence is referred to as a control current. In a VCO (Voltage Controlled Oscillator), a control current corresponding to a control voltage is generated and its oscillation frequency is controlled by the control current.

It is important that there is consistency between oscillation frequencies of a plurality of oscillation circuits. When a considerable number of semiconductor devices having the oscillation circuit are manufactured, large variation in the oscillation frequencies causes malfunctions in many semiconductor devices.

Japanese Unexamined Patent Publication JP-Sho-62-274913 (Patent document No. 1) indicates that variation in threshold voltages of MOS transistors in a circuit for supplying a control current charging the capacitors causes the variation in the oscillation frequencies. The patent document No. 1 discloses a voltage controlled oscillator which suppresses such a variation in the oscillation frequencies by canceling the variation in the threshold voltages of the MOS transistors.

Variation in the threshold voltages of MOS transistors that configures a feedback path for providing a feedback of the applied voltages to the capacitors to the charge-discharge circuit (for example, the MOS transistors that configures the inverter N3, N4 in FIG. 1 in the patent document No. 1) can also cause the variation in the oscillation frequencies. It is preferable in the oscillation circuit that the influences of the variation in the threshold voltages of the MOS transistors constituting the feedback path is eliminated and the variation in the oscillation frequencies is reduced.

SUMMARY OF THE INVENTION

An object of the present invention is generally to provide a technique for reducing variation in oscillation frequency of an oscillation circuit.

More specifically, an object of the present invention is to provide an oscillation circuit including an astable multivibrator with two capacitors and a charge-discharge circuit for alternately charging and discharging the capacitors, which suppresses the influence of the variation in threshold voltages of MOS transistors constituting a feedback path for providing a feedback of voltages generated in the capacitors to the charge-discharge circuit, and thereby reduces the variation in the oscillation frequency.

In an aspect of the present invention, an oscillation circuit includes a first MOS transistor, a second MOS transistor, a current supply circuit, a threshold correction circuit and a charge-discharge circuit. The first MOS transistor has a gate connected to a first node and a source connected to a first terminal with a predetermined potential. The second MOS transistor has a gate connected to a second node and a source connected to a second terminal with the predetermined potential. The current supply circuit supplies a control current to a third node. The threshold correction circuit supplies a correction current to the third node. A charge current is a superposition of the control current and the correction current. The charge-discharge circuit charges and discharges the first node and the second node alternately by supplying the charge current to the first node and the second node alternately in response to potentials of drains of the first MOS transistor and the second MOS transistor. Here, the threshold correction circuit has a third MOS transistor and a correction current supplying circuit. The third MOS transistor is formed on the same semiconductor substrate as the first MOS transistor and the second MOS transistor. The correction current supplying circuit supplies the correction current to the third node in response to a threshold voltage of the third MOS transistor.

Typically, the correction current supplying circuit increases the correction current with increasing absolute value of the threshold voltage of the third MOS transistor.

The threshold voltage of the third MOS transistor formed on the same semiconductor substrate as the first and the second MOS transistors varies in a similar way to the threshold voltages of the first and the second MOS transistors. Therefore, the threshold correction circuit can generate the correction current in response to the threshold voltages of the first and the second MOS transistors. The first and the second MOS transistors feed back the potentials of the first node and the second node to the charge-discharge circuit, respectively. Thus, the oscillation circuit according to the present invention can suppress the variation in the oscillation frequency caused by the variation in the threshold voltage of the first or the second MOS transistor.

When the first to the third MOS transistors are N-channel MOS transistors, the predetermined potential mentioned above is the ground potential.

The threshold correction circuit can further has a constant current source. In this case, the third MOS transistor has a drain connected to the constant current source, a gate connected to the drain, and a source connected to a third terminal with the predetermined potential. The correction current supplying circuit preferably generates the correction current in response to a potential of the gate of the third MOS transistor. When the threshold correction circuit has such the configuration, the potential of the gate of the third MOS transistor is associated with the threshold voltage of the third MOS transistor. Therefore, by using the potential of the gate of the third MOS transistor, it is possible to generate the correction current appropriately.

More preferably, the correction current supplying circuit includes a differential amplifier and a current mirror. The differential amplifier outputs an output current in response to a difference between a reference potential and the potential of the gate of the third MOS transistor. The current mirror generates the correction current which is proportional to the output current.

It is preferable that the current supply circuit generates the control current in response to a control voltage. In this case, the oscillation circuit functions as a VCO (Voltage Controlled Oscillator).

In order to obtain a desired oscillation frequency, it is also preferable that the oscillation circuit has a first capacitor and a second capacitor. The first capacitor is connected between the first node and a fourth terminal having the predetermined potential. The second capacitor is connected between the second node and a fifth terminal having the predetermined potential.

According to the present invention, a technique is provided for reducing the variation in the oscillation frequency of the oscillation circuit.

More specifically, provided according to the present invention is an oscillation circuit including an astable multivibrator with two capacitors and a charge-discharge circuit for alternately charging and discharging the capacitors, which suppresses the influence of the variation in threshold voltages of MOS transistors constituting a feedback path for providing a feedback of voltages generated in the capacitors to the charge-discharge circuit, and thereby reduces the variation in the oscillation frequency.

DESCRIPTION OF THE PREFERRED EMBODIMENTS

Figure 1:
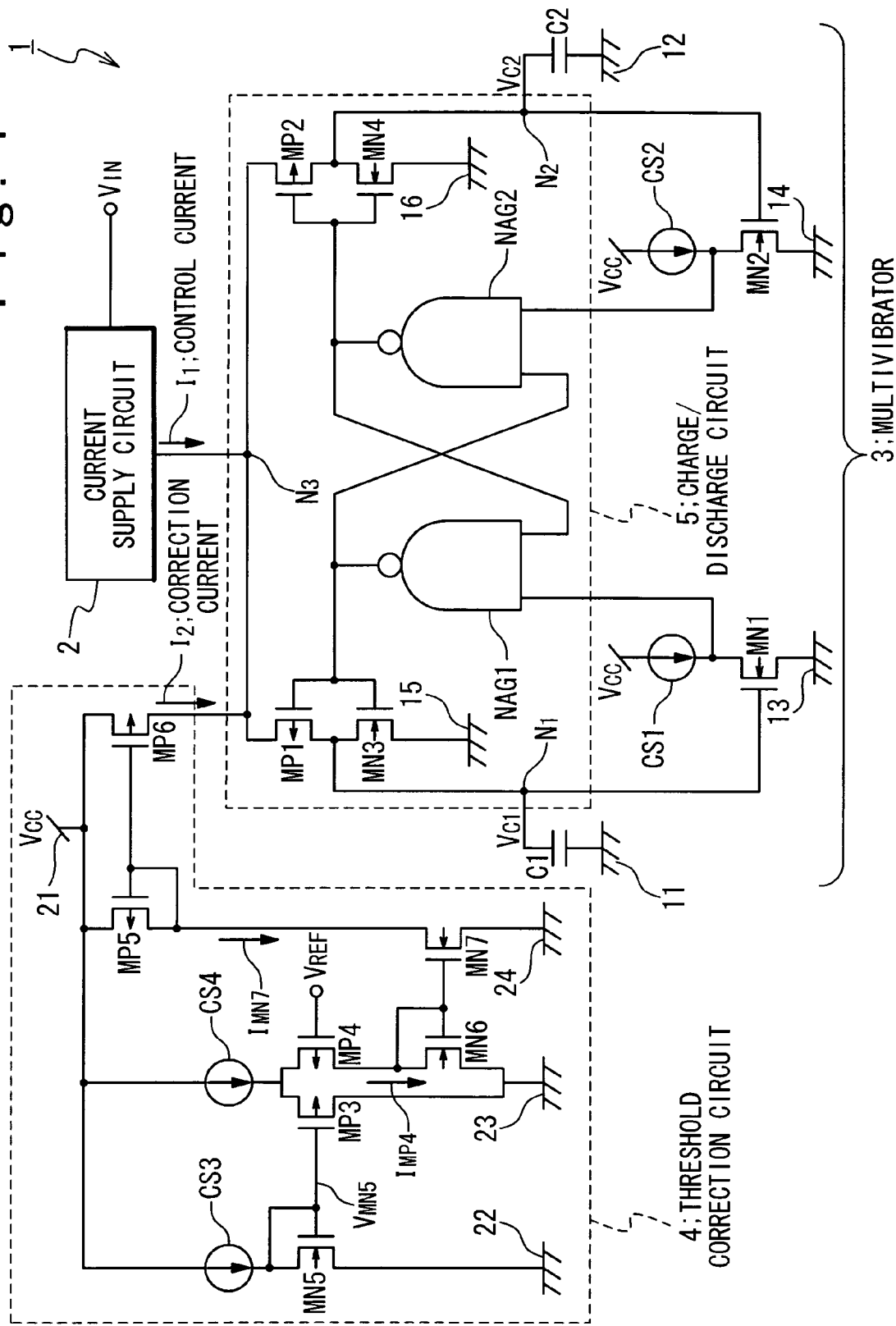
FIG. 1 is a block diagram showing an oscillation circuit according to an embodiment of the present invention.

Embodiments of the present invention will be described below with reference to the attached drawings.

1. Configuration of Oscillation Circuit 1.1. General Configuration

FIG. 1 is a block diagram showing a configuration of an oscillation circuit in an embodiment of the present invention. The oscillation circuit 1 is a voltage controlled oscillator (VCO). The oscillation circuit 1 has a current supply circuit 2, a multivibrator 3, and a threshold correction circuit 4. The current supply circuit 2, the multivibrator 3 and the threshold correction circuit 4 are monolithically integrated onto a semiconductor chip. In response to a control voltage $V_{IN}$, the current supply circuit 2 supplies a control current $I_1$ to a node N3 of the multivibrator 3. The threshold correction circuit 4 supplies a correction current $I_2$ to the node N3. The correction current $I_2$ is superposed on the control current $I_1$ at the node N3, which generates a charge current. The multivibrator 3 uses the charge current to alternately charge the two capacitors C1 and C2 for the oscillation.

Higher control voltage $V_{IN}$ gives larger control current $I_1$. Since the larger control current $I_1$ generates larger charge current and hence higher oscillation frequency, the oscillation frequency can be controlled by the control voltage $V_{IN}$.

The amplitude of the correction current $I_2$ is determined according to a threshold voltage of an N-channel MOS transistor included in the multivibrator 3. This plays an important role for reducing the variation in the oscillation frequency of the multivibrator 3, as will be described later.

1.2. Configuration of the Multivibrator

The multivibrator 3 has capacitors C1, C2, constant current sources CS1, CS2, N-channel MOS transistors MN1, MN2, and a charge-discharge circuit 5. The capacitor C1 is inserted between a node N1 and a grounding terminal 11, and the capacitor C2 is inserted between a node N2 and a grounding terminal 12. The node N1 is connected to a gate of the N-channel MOS transistor MN1. A source of the N-channel MOS transistor MN1 is connected to a grounding terminal 13 and its drain is connected to the constant current source CS1. Similarly, the node N2 is connected to a gate of the N-channel MOS transistor MN2. A source of the N-channel MOS transistor MN2 is connected to a grounding terminal 14 and its drain is connected to the constant current source CS2.

The charge-discharge circuit 5 is a circuit for charging and discharging the capacitors C1 and C2. The charge-discharge circuit 5 includes P-channel MOS transistors MP1, MP2, N-channel MOS transistors MN3, MN4, and NAND gates NAG1, NAG2.

The NAND gates NAG1, NAG2 configure a flip flop whose status switches in response to electric potentials of drains of the N-channel MOS transistors MN1, MN2. An output of the NAND gate NAG1 is connected to one input of the NAND gate NAG2, and an output of the NAND gate NAG2 is connected to one input of the NAND gate NAG1. Another input of the NAND gate NAG1 is connected to the drain of the N-channel MOS transistor MN1. Similarly, another input of the NAND gate NAG2 is connected to the drain of the N-channel MOS transistor MN2.

A signal for switching the charging and the discharging of the capacitor C1 is outputted from the output of the NAND gate NAG1. The output of the NAND gate NAG1 is connected to gates of the P-channel MOS transistor MP1 and the N-channel MOS transistor MN3. A source of the P-channel MOS transistor MP1 is connected to the node N3 to which the control current $I_1$ is supplied, and a drain of the P-channel MOS transistor MP1 is connected to a drain of the N-channel MOS transistor MN3. A source of the N-channel MOS transistor MN3 is connected to a grounding terminal 15. The drains of the P-channel MOS transistor MP1 and the N-channel MOS transistor MN3 are connected to the node N1. When the output of the NAND gate NAG1 turns to "Low", the charge current is supplied from the node N3 to the capacitor C1 through the node N1. When the output of the NAND gate NAG1 turns to "High", the node N1 is connected to the grounding terminal 15 and the capacitor C1 discharged.

Similarly, a signal for switching the charging and the discharging of the capacitor C2 is outputted from the output of the NAND gate NAG2. The output of the NAND gate NAG2 is connected to gates of the P-channel MOS transistor MP2 and the N-channel MOS transistor MN4. A source of the P-channel MOS transistor MP2 is connected to the node N3 to which the control current $I_1$ is supplied, and a drain of the P-channel MOS transistor MP2 is connected to a drain of the N-channel MOS transistor MN4. A source of the N-channel MOS transistor MN4 is connected to a grounding terminal 16. The drains of the P-channel MOS transistor MP2 and the N-channel MOS transistor MN4 are connected to the node N2. When the output of the NAND gate NAG2 turns to "Low", the charge current is supplied from the node N3 to the capacitor C2 through the node N2. When the output of the NAND gate NAG2 turns to "High", the node N2 is connected to the grounding terminal 16 and the capacitor C2 discharged.

1.3. Configuration of the Threshold Correction Circuit

The threshold correction circuit 4 includes N-channel MOS transistors MN5, MN6, MN7, P-channel MOS transistors MP3, MP4, MP5, MP6, and constant current sources CS3, CS4.

The N-channel MOS transistor MN5 and the constant current source CS3 form a circuit for generating a potential $V_{MN5}$ which is associated with a threshold voltage $V_{TH}$ of the transistor MN5. A source of the N-channel MOS transistor MN5 is connected to a grounding terminal 22, and a drain of the N-channel MOS transistor MN5 is connected to the constant current source CS3. The N-channel MOS transistor MN5 is diode-connected, namely, its drain is connected to its gate. The potential $V_{MN5}$ associated with the threshold voltage of the transistor MN5 appears at the gate of the N-channel MOS transistor MN5. The potential $V_{MN5}$ at the gate of the N-channel MOS transistor MN5 becomes higher as the threshold voltage $V_{TH}$ of the N-channel MOS transistor MN5 is higher.

The P-channel MOS transistors MP3, MP4 and the constant current source CS4 constitute a differential amplifier that compares the potential $V_{MN5}$ at the gate of the transistor MN5 with a reference potential $V_{REF}$. Sources of the P-channel MOS transistors MP3 and MP4 are connected to the constant current source CS4. A drain of the P-channel MOS transistor MP3 is connected to a grounding terminal 23. A gate of the P-channel MOS transistor MP3 is connected to the gate of the N-channel MOS transistor MN5. The reference potential $V_{REF}$ is supplied to a gate of the P-channel MOS transistor MP4. A drain of the P-channel MOS transistor MP4 functions as an output terminal for outputting an output current $I_{MP4}$. The output current $I_{MP4}$ is expressed in the first-order approximation as the following equation:

$$I_{MP4} = \alpha(V_{MN5} - V_{REF})$$

The N-channel MOS transistors MN6, MN7 configure a current mirror that generates a current $I_{MN7}$ proportional to the output current $I_{MP4}$ flowing through the P-channel MOS transistor MP4. A source of the N-channel MOS transistor MN6 is connected to a grounding terminal 23, and a drain of the N-channel MOS transistor MN6 is connected to the drain of the P-channel MOS transistor MP4. The N-channel MOS transistor MN6 is diode-connected, namely, its drain is connected to its gate. A gate of the N-channel MOS transistor MN7 is connected to the gate of the N-channel MOS transistor MN6, and a source of the N-channel MOS transistor MN7 is connected to a grounding terminal 24. A drain of the N-channel MOS transistor MN7 functions as an output of the current mirror.

The P-channel MOS transistors MP5, MP6 configure a current mirror that functions as an output stage of the threshold correction circuit 4. Sources of the P-channel MOS transistors MP5 and MP6 are connected to a power supply terminal 21 having power source potential $V_{cc}$. A drain of the P-channel MOS transistor MP5 is connected to the drain of the N-channel MOS transistor MN7. The same current as the current $I_{MN7}$ flowing through the N-channel MOS transistor MN7 also flows through the P-channel MOS transistor MP5. The P-channel MOS transistor MP5 is diode-connected, namely, its drain is connected to its gate. A gate of the P-channel MOS transistor MN6 is connected to the gate of the P-channel MOS transistor MP5. The correction current $I_2$ which is proportional to the current $I_{MN7}$ is outputted from a drain of the P-channel MOS transistor MP6.

Thus, the P-channel MOS transistors MP3, MP4, MP5, MP6, and the N-channel MOS transistors MN6, MN7 form a correction current supplying circuit which supplies the correction current $I_2$ to the node N3.

The threshold correction circuit 4 having such configuration generates the correction current $I_2$. The correction current $I_2$ increases as the threshold voltage $V_{TH}$ of the N-channel MOS transistor MN5 becomes higher. The higher threshold voltage $V_{TH}$ of the N-channel MOS transistor MN5 gives the higher potential $V_{MN5}$ at the gate of the transistor MN5. As can be understood from the above-mentioned equation, the output current $I_{MP4}$ flowing through the P-channel MOS transistor MP4 of the differential amplifier becomes larger as the potential $V_{MN5}$, namely, the threshold voltage $V_{TH}$ of the N-channel MOS transistor MN5 becomes higher. The current $I_{MN7}$ is proportional to the output current $I_{MP4}$, and the correction current $I_2$ is proportional to the current $I_{MN7}$. Therefore, the higher the threshold voltage $V_{TH}$ of the N-channel MOS transistor MN5 becomes, the larger the correction current $I_2$ becomes.

2. Operation of the Oscillation Circuit 2.1. Oscillation Operation of the Multivibrator The multivibrator 3 oscillates by supplying the charge current which is the superposition of the control current $I_1$ and the correction current $I_2$ to the capacitors C1 and C2 alternately. The detailed operation of the multivibrator 3 is as follows.

Let us consider an initial status in which the output of the NAND gate NAG1 is "Low", the output of the NAND gate NAG2 is "High", the capacitor C1 is not charged and the capacitor C2 is charged. Under this state, as the capacitor C1 is not charged, the potential of the node N1 is "Low". Thus, the N-channel MOS transistor MN1 is turned off, and the potential of the drain of the N-channel MOS transistor MN1 is "High". On the other hand, as the capacitor C2 is charged, the potential of the node N2 is "High". Thus, the N-channel MOS transistor MN2 is turned on, and the potential of the drain of the N-channel MOS transistor MN2 is "Low".

In response to the potential "High" at the output of the NAND gate NAG2, the P-channel MOS transistor MP2 connected to the output of the NAND gate NAG2 is turned off, and the N-channel MOS transistor MN4 is turned on. As the N-channel MOS transistor MN4 is turned on, the node N2 is connected to the grounding terminal 16, and the capacitor C2 is discharged until its voltage is reduced to zero.

On the other hand, in response to the potential "Low" at the output of the NAND gate NAG1, the P-channel MOS transistor MP1 connected to the output of the NAND gate NAG1 is turned on, and the N-channel MOS transistor MN3 is turned off. As the P-channel MOS transistor MP1 is turned on, the charge current is supplied to the capacitor C1 and the charging of the capacitor C1 starts. As described above, the charge current is generated by the superposition of the control current $I_1$ and the correction current $I_2$ at the node N3. As the capacitor C1 is charged, the potential of the node N1, namely, the potential of the gate of the N-channel MOS transistor MN1 increases.

When the charging of the capacitor C1 proceeds and a voltage between the gate and the source of the N-channel MOS transistor MN1 exceeds the threshold voltage of the N-channel MOS transistor MN1, the transistor MN1 is turned on. When the N-channel MOS transistor MN1 is turned on, the potential of its drain, namely, the second input of the NAND gate NAG1 is switched to "Low". This causes a transition of the state of the flip flop which is configured with the NAND gates NAG1, NAG2. That is to say, the output of the NAND gate NAG1 turns to "High", and the output of the NAND gate NAG2 turns to "Low".

When the output of the NAND gate NAG1 is changed to "High" and the output of the NAND gate NAG2 is changed to "Low", the charging of the capacitor C2 and the discharging of the capacitor C1 start. After that, the capacitors C1 and C2 are alternately charged and discharged through the similar processes.

2.2. Action of the Threshold Correction Circuit

As is understood from the oscillation operation of the multivibrator 3 described above, the oscillation frequency of the multivibrator 3 is influenced by the threshold voltages of the N-channel MOS transistors MN1, MN2 which feed back the voltages of the capacitors C1, C2 to the charge/discharge circuit 5. Conventionally, the higher the threshold voltages of the N-channel MOS transistors MN1, MN2 (these are generally almost identical to each other) become, the longer the time from the start of the charging of the capacitors C1, C2 to the turning on of the N-channel MOS transistors MN1, MN2 becomes, which causes the lower oscillation frequency of the oscillation circuit 1.

The threshold correction circuit 4 generates larger correction current $I_2$ as the threshold voltages of the N-channel MOS transistors MN1, MN2 become higher. Here, the threshold correction circuit 4 utilizes the fact that the N-channel MOS transistor MN5 in the threshold correction circuit 4 and the N-channel MOS transistors MN1, MN2 which are formed on one semiconductor chip have almost the same threshold voltage. As is well known to those skilled in the art, the threshold voltages of N-channel MOS transistors formed on different semiconductor chips are often different from each other, while the threshold voltages of N-channel MOS transistors formed on one semiconductor chip are substantially the same in many cases. Therefore, the higher the threshold voltages of the N-channel MOS transistors MN1, MN2 are, the higher the threshold voltage of the N-channel MOS transistor MN5 is. As described above, the threshold correction circuit 4 generates the larger correction current $I_2$ as the threshold voltage of the N-channel MOS transistor MN5 is higher. Thus, the threshold correction circuit 4 generates the larger correction current $I_2$ as the threshold voltages of the N-channel MOS transistors MN1, MN2 are higher.

3. Effect of the Present Invention

As the threshold voltages of the N-channel MOS transistors MN1, MN2 become higher, the larger correction current $I_2$ is supplied to the charge/discharge circuit 5, which reduces the fluctuation of the oscillation frequency caused by the variation in the threshold voltages of the N-channel MOS transistors MN1, MN2.

As the threshold voltages of the N-channel MOS transistors MN1, MN2 become higher, the larger correction current $I_2$ is supplied to the charge/discharge circuit 5. The larger correction current $I_2$ provides the larger charge current, which causes the less charging time and hence the higher oscillation frequency of the oscillation circuit 1. In this way, the increase in the correction current $I_2$ suppresses the reduction of the oscillation frequency caused by the high threshold voltages of the N-channel MOS transistors MN1, MN2. Also, the decrease in correction current $I_2$ suppresses the enhancement of the oscillation frequency caused by the low threshold voltages of the N-channel MOS transistors MN1, MN2.

As described above, an appropriate correction current $I_2$ is supplied to the oscillation circuit 1 according to the threshold voltages of the N-channel MOS transistors MN1, MN2. Therefore, the variation in the oscillation frequency of the oscillation circuit 1 is reduced.

It is obvious to those skilled in the art that a circuit complementary to the oscillation circuit 1 in FIG. 1 can be used in the embodiment of the present invention. In this case, the P-channel MOS transistor is replaced by a N-channel MOS transistor, and the N-channel MOS transistor is replaced by a P-channel MOS transistor. Furthermore, the direction of the current flowing in the oscillation circuit 1 is reversed, the grounding terminal is replaced by a power supply terminal, and the power supply terminal is replaced by a grounding terminal. The threshold correction circuit 4 pulls out the larger correction current $I_2$ from the node N3, as the absolute value of the threshold voltage of the P-channel MOS transistor replacing the N-channel MOS transistors MN1, MN2 becomes larger.

Also, in the case where the node N1 and the node N2 have a sufficiently large capacitance, the capacitors C1 and C2 may not be connected thereto. The node 1 has a capacitance at least not less than a gate capacitance of the N-channel MOS transistor MN1. This is also the same with the case of the node N2. However, in order to obtain an oscillation frequency commonly used, the capacitor C1 and C2 would be necessary.

It will be obvious to one skilled in the art that the present invention may be practiced in other embodiments that depart from the above-described specific details. The scope of the present invention, therefore, should be determined by the following claims.

What is claimed is:

1. An oscillation circuit comprising:
   a first MOS transistor having a gate connected to a first node and a source connected to a first terminal with a predetermined potential;
   a second MOS transistor having a gate connected to a second node and a source connected to a second terminal with said predetermined potential;
   a current supply circuit configured to supply a control current to a third node;
   a threshold correction circuit configured to supply a correction current to said third node; and
   a charge-discharge circuit which charges and discharges said first node and said second node alternately by supplying a charge current which is a superposition of said control current and said correction current to said first node and said second node alternately in response to potentials of drains of said first MOS transistor and said second MOS transistor,
   wherein said threshold correction circuit comprises:
   a third MOS transistor formed on a same semiconductor substrate as said first MOS transistor and said second MOS transistor; and
   a correction current supplying circuit configured to supply said correction current to said third node in response to a threshold voltage of said third MOS transistor.

2. The oscillation circuit according to claim 1,
   wherein said correction current supplying circuit increases said correction current with increasing absolute value of said threshold voltage of said third MOS transistor.

3. The oscillation circuit according to claim 2,
   wherein said threshold correction circuit further comprises a constant current source,
   said third MOS transistor has:
   a drain connected to said constant current source;
   a gate connected to said drain; and
   a source connected to a third terminal with said predetermined potential, and
   said correction current supplying circuit generates said correction current in response to a potential of said gate of said third MOS transistor.

4. The oscillation circuit according to claim 3,
wherein said correction current supplying circuit includes:
a differential amplifier configured to output an output current in response to a difference between a reference potential and said potential of said gate of said third MOS transistor; and
a current mirror configure to generate said correction current proportional to said output current.

5. The oscillation circuit according to claim 2,
wherein said current supply circuit generates said control current in response to a control voltage.

6. The oscillation circuit according to claim 5,
wherein said threshold correction circuit further comprises a constant current source,
said third MOS transistor has:
a drain connected to said constant current source;
a gate connected to said drain; and
a source connected to a third terminal with said predetermined potential, and
said correction current supplying circuit generates said correction current in response to a potential of said gate of said third MOS transistor.

7. The oscillation circuit according to claim 6,
wherein said correction current supplying circuit includes:
a differential amplifier configured to output an output current in response to a difference between a reference potential and said potential of said gate of said third MOS transistor; and
a current mirror configure to generate said correction current proportional to said output current.

8. The oscillation circuit according to claim 2, further comprising:
a first capacitor connected between said first node and a fourth terminal having said predetermined potential; and
a second capacitor connected between said second node and a fifth terminal having said predetermined potential.

9. The oscillation circuit according to claim 8,
wherein said threshold correction circuit further comprises a constant current source,
said third MOS transistor has:
a drain connected to said constant current source;
a gate connected to said drain; and
a source connected to a third terminal with said predetermined potential, and
said correction current supplying circuit generates said correction current in response to a potential of said gate of said third MOS transistor.

10. The oscillation circuit according to claim 9,
wherein said correction current supplying circuit includes:
a differential amplifier configured to output an output current in response to a difference between a reference potential and said potential of said gate of said third MOS transistor; and
a current mirror configured to generate said correction current proportional to said output current.

11. The oscillation circuit according to claim 8,
wherein said current supply circuit generates said control current in response to a control voltage.

12. A method of operating an oscillation circuit,
said oscillation circuit including:
a first MOS transistor having a gate connected to a first node and a source connected to a first terminal with a predetermined potential; and
a second MOS transistor having a gate connected to a second node and a source connected to a second terminal with said predetermined potential,
said method comprising:
supplying a control current;
supplying a correction current which increases as absolute values of threshold voltages of said first MOS transistor and said second MOS transistor become larger; and
charging and discharging said first node and said second node alternately by supplying a charge current which is a superposition of said control current and said correction current to said first node and said second node alternately in response to potentials of drains of said first MOS transistor and said second MOS transistor.

* * * * *